(12) United States Patent
Boerstler et al.

(10) Patent No.: US 8,736,304 B2
(45) Date of Patent: May 27, 2014

(54) SELF-BIASED HIGH SPEED LEVEL SHIFTER CIRCUIT

(75) Inventors: David William Boerstler, Round Rock, TX (US); Eskinder Hailu, Austin, TX (US); Kazuhiko Miki, Round Rock, TX (US); Jieming Qi, Austin, TX (US)

(73) Assignees: International Business Machines Corporation, Armonk, NY (US); Kabushiki Kaisha Toshiba, Tokyo (JP)

( * ) Notice: Subject to any disclaimer, the term of this patent is extended or adjusted under 35 U.S.C. 154(b) by 1238 days.

(21) Appl. No.: 11/171,758

(22) Filed: Jun. 30, 2005

(65) Prior Publication Data

US 2007/0008003 A1    Jan. 11, 2007

(51) Int. Cl.
*H03K 19/0175* (2006.01)

(52) U.S. Cl.
USPC ............. 326/81; 326/86; 327/109; 327/333

(58) Field of Classification Search
USPC ............. 326/62–63, 68, 80–83, 86; 327/333, 327/108–109
See application file for complete search history.

(56) References Cited

U.S. PATENT DOCUMENTS

| | | | |
|---|---|---|---|
| 5,486,774 A * | 1/1996 | Douseki et al. | 326/33 |
| 6,046,604 A * | 4/2000 | Horiguchi et al. | 326/83 |
| 6,441,670 B1 * | 8/2002 | Coughlin et al. | 327/323 |
| 6,879,191 B2 * | 4/2005 | Davis | 327/112 |
| 7,436,201 B2 * | 10/2008 | Kumar | 326/27 |
| 2003/0094988 A1 * | 5/2003 | Suzuki | 327/333 |
| 2005/0212560 A1 * | 9/2005 | Hidaka | 326/83 |

OTHER PUBLICATIONS

Sedra/Smith, "Microelectronic Circuits: 5th Edition" Published by Oxford University Press (C) 2004. (pp. 79, Appendix D-1-D-15, and E-1-E4).*

Sedra/Smith, "Microelectronic Circuits: 5th Edition" Published by Oxford University Press (C) 2004. (pp. 79, Appendix D-1-D-15, and E-1-E4.*

* cited by examiner

*Primary Examiner* — Jason M Crawford
(74) *Attorney, Agent, or Firm* — James L. Baudino

(57) ABSTRACT

A method and apparatus for translating signals between different components located in different power boundaries in a mixed voltage system. A level shifter system includes a first level shifter circuit connected to a first voltage source. A second level shifter circuit connects to a second voltage source. An intermediate level shifter circuit has an input that connects to the output of the first level shifter circuit. The output of the intermediate level shifter circuit connects to the input of the second level shifter circuit. The intermediate level shifter circuit uses an intermediate voltage source having an intermediate voltage about midway between the first voltage of the first voltage source and the second voltage of the second voltage source.

10 Claims, 3 Drawing Sheets

US 8,736,304 B2

SELF-BIASED HIGH SPEED LEVEL SHIFTER CIRCUIT

BACKGROUND OF THE INVENTION

1. Field of the Invention

The present invention relates generally to processing signals in circuits and in particular to a method and apparatus for translating a signal from one voltage domain to another voltage domain in circuits.

2. Description of the Related Art

In designing and producing devices, such as processors and for other applications, multiple supply voltages are typically present. Analog circuits typically require higher voltage supplies, AVDD, than logic circuit voltage supplies, VDD. It is desirable to have reduced or low voltages to reduce the amount of power consumed by the logic circuits in a chip. Higher power supply voltages are desirable for analog circuits because many of these types of circuits do not perform well at lower voltages. Additionally, different power supply voltages are present for input/output boundaries because these interfaces often times are designed to be compatible with older products, which may run at higher voltage power supplies. These different power voltage supplies result in devices having mixed voltages.

In using these mixed voltage devices, an interface is designed to send signals from one voltage domain to another voltage domain. Level shifter circuits are currently used for translating signals between power boundaries and mixed-voltage systems. Level shifters are commonly found in mixed signal, analog, and digital circuits, such as phase lock loops and input/output circuits. With respect to signals and their widths as clock frequencies and data rates increase, it becomes progressively more difficult to control a duty cycle since the signal distortion due to process and environment becomes a much more significant component of the bit or cycle time. Furthermore, power supply adjustments, both active and passive, used for power management or speed sorting make circuit optimization of a duty cycle difficult because the design requirement space becomes so broad. Conventional high frequency level shifter designs may use alternating current (AC) coupling techniques or trimming techniques to improve performance over a wide set of application conditions. However, area, cost, and additional test time in manufacturing can make these methods impractical.

Therefore, it would be advantageous to have an improved method and apparatus for translating signals between different components in a mixed voltage system.

SUMMARY OF THE INVENTION

The present invention provides a method and apparatus for sending signals between different components located in different power boundaries in a mixed voltage system. A level shifter system includes a first level shifter connected to a first voltage source. A second level shifter connects to a second voltage source. An intermediate level shifter has an input that connects to the output of the first level shifter circuit. The output of the intermediate level shifter connects to the input of the second level shifter. The intermediate level shifter uses an intermediate voltage source having an intermediate voltage about midway between the first voltage of the first voltage source and the second voltage of the second voltage source.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
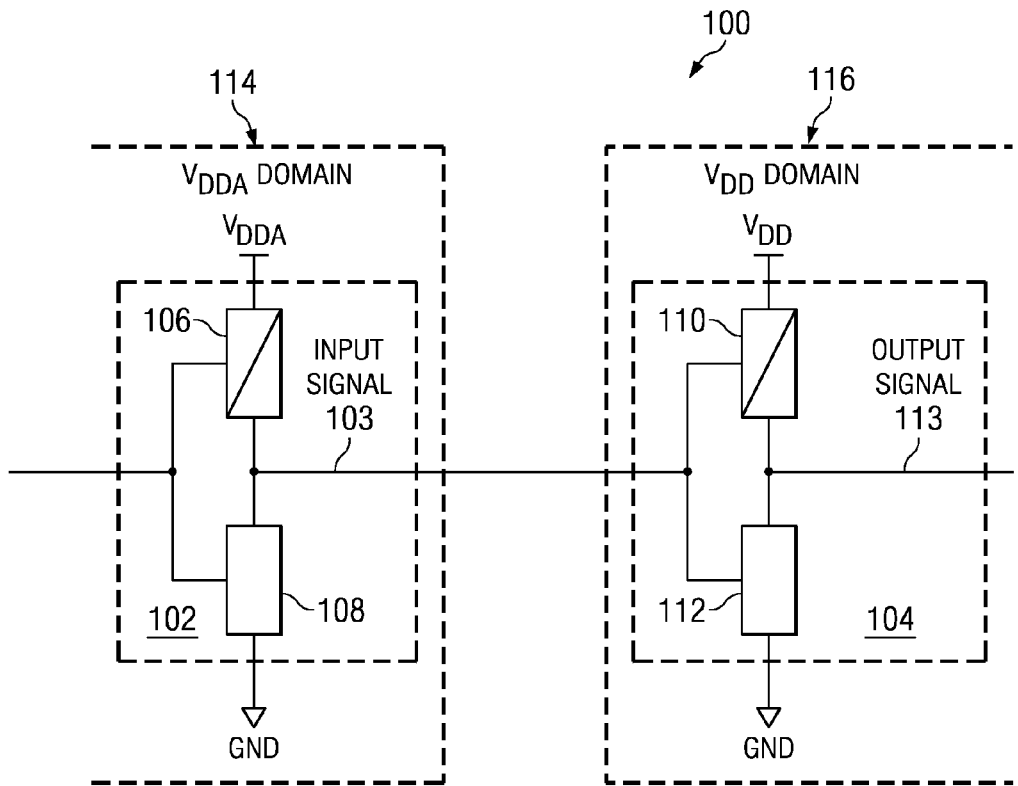
FIG. 1 is a diagram of a known level shifter system.

With reference to the figures and in particular with reference to FIG. 1, a diagram of a known level shifter system is depicted. In this example, level shifter system 100 includes level shifter 102 and level shifter 104. These level shifter circuits take the form of inverters in these examples. Level shifter 102 contains transistor 106 and transistor 108. Level shifter circuit 104 contains transistor 110 and transistor 112. In these illustrative examples, transistors 106 and 110 are p-channel transistors, while transistors 108 and 112 are n-channel transistors. In particular, these transistors are complimentary metal oxide semiconductor (CMOS) transistors. Of course, these transistors may be implemented using other types of transistors other than CMOS transistors depending on the particular implementation. Each of these circuits serves to invert a signal received at the input.

In this example, level shifter 102 is an inverter in which transistor 106 has a source that connects to power supply voltage VDDA. The drain of transistor 106 connects to the drain of transistor 108. Transistor 108 has its source connected to ground power supply voltage GND. The gates of transistors 106 and 108 connect to an input for a signal. The output signal for level shifter 102 is formed by the connection of the drains of transistors 106 and 108. The output of level shifter 102 generates input signal 103 and connects to the input of level shifter 104. The input in level shifter 104 is formed by a connection to the gates of transistors 110 and 112.

In a similar fashion, the source of transistor 110 in level shifter 104 connects to an upper power supply voltage VDD with the drain of this transistor connecting to the drain of transistor 112. The source for transistor 112 connects to a ground power supply voltage GND. The drains of transistors 110 and 112 form an output to generate output signal 113. In this example, upper power supply voltage VDDA is at a higher voltage than upper power supply voltage VDD.

In these examples, level shifter circuit 102 is in VDDA voltage domain 114, while level shifter circuit 104 is located in VDD voltage domain 116. Input signal 103 generated by level shifter circuit 102 is sent from VDDA voltage domain 114 to VDD voltage domain 116 for receipt by level shifter circuit 104.

Figure 2:
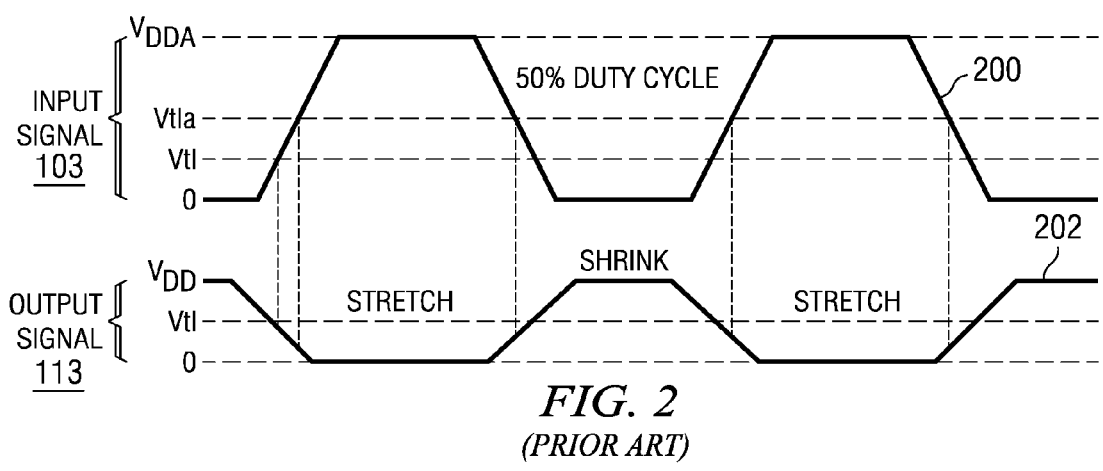
FIG. 2 is a timing diagram for signals in the level shifter system in FIG. 1.

Turning to FIG. 2, a timing diagram for signals in the lever shifter system illustrated in FIG. 1 is depicted. In this example, input signal 200 illustrates input signal 103 generated by lever shifter 102 in FIG. 1. Output signal 202 illustrates output signal 113 generated by level shifter circuit 104 in FIG. 1. Voltage Vtl is a logic threshold for the VDD domain, while voltage Vtla is a logic threshold for the VDDA domain. Voltage VDDA is greater than voltage VDD.

In these examples, duty cycle degradation occurs as a signal passes across the voltage domain between level shifter circuit 102 and level shifter circuit 104. A duty cycle is the ratio of a pulse width to the period and is typically expressed as a percentage.

As depicted, a threshold voltage Vtla indicates when a logic change occurs in the signal. In input signal 200, an ideal input signal with a fifty percent duty cycle is shown as it enters the VDD domain. If level shifter 104 is an inverter that has a conventionally balanced P/N ratio, the duty cycle of the output signal is seriously degraded because the effect of threshold Vtl for this receiving inverter is substantially lower than the logic threshold Vtla in the VDD domain when comparing input signal 200 to output signal 202.

Subsequent logic stages generally propagate or cause further accumulation of this error for normal P/N ratios. As a result, the signals are degradated or even lost. If the receiving inverter has its P/N strength adjusted to preserve the duty cycle, this inverter generally only holds true for a very limited range of power supply voltages VDDA and VDD.

As can be seen, in output signal 202, the pulse width stretches and shrinks with respect to input signal 200. Maintaining the same pulse width requires a different threshold level. To obtain the same pulse width for input signal 200, a higher voltage threshold is required, for example level shifter 104, vtl=vtla.

Figure 3:
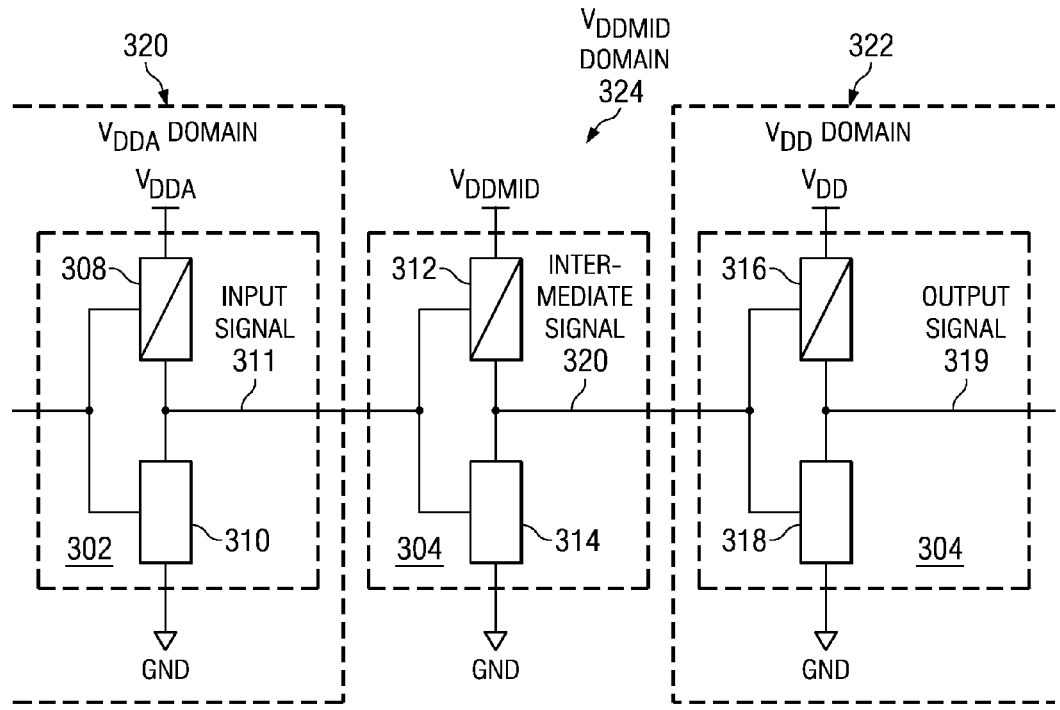
FIG. 3 is a self-biased high speed level shifter system in accordance with an illustrative embodiment of the present invention.

Turning next to FIG. 3, a self-biased high speed level shifter system is depicted in accordance with an illustrative embodiment of the present invention. In this example, level shifter system 300 contains level shifter circuits 302, 304, and 306. Level shifter circuit 302 is an inverter in this example and is powered by power supply voltage VDDA, while lever shifter circuit 306 is powered by power supply voltage VDD. These power supply voltages are the same power supply voltages as illustrated in FIGS. 1 and 2 for purposes of illustration in these examples. Level shifter circuits 304 and 306 also take the form of inverters in these particular examples. These inverters are implemented using CMOS transistors in these examples. Of course, other types of circuits may be used depending on the particular implementation. Examples of other circuits that may be used include, for example, simple logic gates, such as "NAND, NOR, AND, or OR".

Level shifter circuit 302 contains transistors 308 and 310; level shifter circuit 304 contains transistors 312 and 314; and level shifter circuit 306 contains transistors 316 and 318.

Transistors 308, 312, and 316 are p-channel transistors, while transistors 310, 314, and 318 are n-channel transistors. In level shifter circuit 302, the source of transistor 308 connects to upper power supply voltage VDDA with the source of transistor 310 connecting to lower power supply voltage GND. The drains of transistors 308 and 310 connect to each other and form an output for input signal 311 to be sent from level shifter circuit 302 to level shifter circuit 306 through level shifter circuit 304. The gates of transistors 308 and 310 receive signals from a source circuit.

The source of transistor 316 connects to upper power supply voltage VDD, while the source of transistor 318 connects to lower power supply voltage GND in level shifter circuit 306. The gates of transistors 316 and 318 in level shifter circuit 306 form an input to receive input signals transmitted from level shifter circuit 302 through level shifter circuit 304. The drains of transistors 316 and 318 form an output for output signal 319.

Transistor 312 in level shifter circuit 304 has a source that connects to upper power supply voltage VDDMID, while the source of transistor 314 connects to lower power supply voltage GND. The gates of transistors 312 and 314 form an input to receive input signal 311 transmitted by level shifter circuit 302. The drains of transistors 312 and 314 connect to the gates of transistors 316 and 318 to transmit intermediate signal 320 to level shifter circuit 306.

In these illustrative examples, level shifter circuit 302 is located in VDDA domain 320, while level shifter circuit 306 is located in VDD domain 322. Level shifter circuit 304 is located in VDDMID domain 324. This particular configuration allows for transmission of signals from one voltage domain to another voltage domain in a manner that reduces the stretching and shrinking of the pulse width of signals received at the target domain.

Level shifter system 300 translates a high speed signal from one voltage domain, VDDA to another voltage domain, VDD, while preserving the duty cycle. In this illustrative example, voltage VDDA is assumed to be an analog supply voltage operating at a higher voltage than the core power supply voltage VDD. Power supply voltage VDD powers a majority of the logic within a device, such as a chip or a processor. Level shifter system 300, however, also is operable for low to high voltage interfaces as well.

In this illustrative example, a single intermediate stage in the form of level shifter circuit 304 is depicted for purposes of illustration. However, other numbers of inverter stages may be used. In these examples, additional inverter stages should form an odd number of inverter stages for this particular example. Otherwise, an even number of inverter stages would cause an inversion of the signal sent to VDD domain 322 from VDDA domain 320. Such an inversion may be used depending on the particular implementation. The power supply voltage powering level shifter circuit 304 is voltage VDDMID. This voltage is equal to the average value of power supply voltage VDDA and power supply voltage VDD in these examples. In these examples, deviations from VDDMID may create duty cycle errors. The tolerances for components, such as those shown in FIG. 5 and FIG. 6 below, are typically controlled through known mechanisms, such as resistor tracking. Tolerances of voltages VDDA and VDD are less important because the voltage VDDMID is appropriately adjusted using the different circuits for the different aspects of the present invention.

Figure 4:
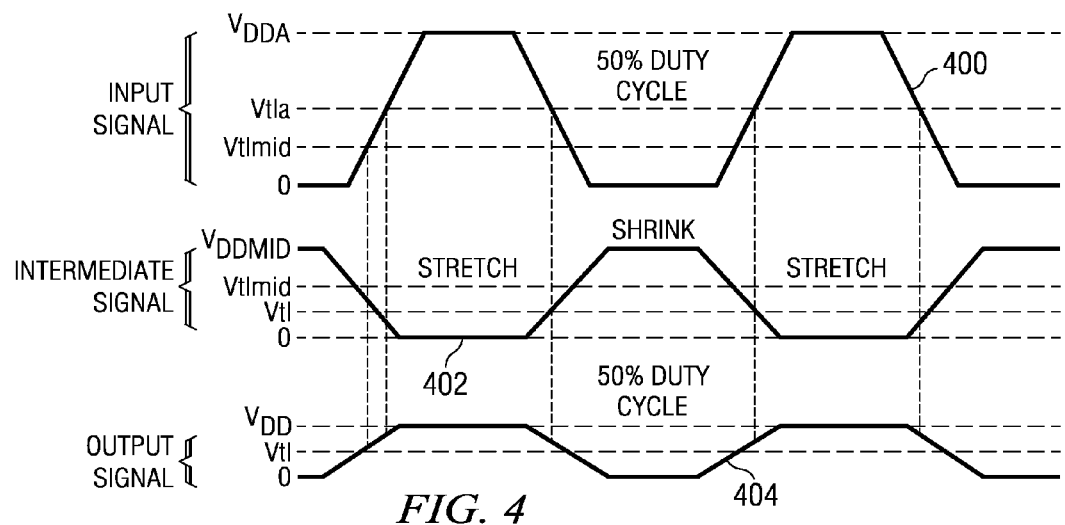
FIG. 4 is a timing diagram for signals in the level shifter circuit illustrated in FIG. 3 in accordance with an illustrative embodiment of the present invention.

Turning now to FIG. 4, a timing diagram for signals in the level shifter circuit illustrated in FIG. 3 is depicted in accordance with an illustrative embodiment of the present invention. In this timing diagram, input signal 400 is input signal 311 generated by level shifter circuit 302 in VDDA domain 320 in FIG. 3, intermediate signal 402 represents intermediate signal 320 generated by level shifter circuit 304 in VDDMID domain 324 in FIG. 3, and output signal 404 is output signal 319 generated by level shifter circuit 306 in VDD domain 322 in FIG. 3. Signal 400 represents input signal 311 generated by level shifter circuit 302. Power supply voltage VDDA is greater than power supply voltage VDD in this example. Power supply voltage VDDMID is an average of power supply voltage VDDA and power supply voltage VDD. Voltage level Vtl is a logic threshold for the VDD domain while voltage level Vtla is a logic threshold for the VDDA domain. Voltage level Vtlmid is a logic threshold used for the VDDMID domain. These threshold voltages are used to identify when a logic zero or a logic one is present in the circuit.

As can be seen, a fifty percent duty cycle is present in these examples in input signal 400. This duty cycle is stretched and shrunk when input signal 400 is sent into the input of level shifter circuit 304 in FIG. 3. Intermediate signal 402 is the output, intermediate signal 320, of level shifter circuit 304 into the input of level shifter circuit 306 in FIG. 3 resulting in output signal 404, which is output signal 319 in FIG. 3. In FIG. 4, output signal 404 has fifty percent duty cycle without requiring altering of threshold levels. Significant duty cycle distortion is introduced by the lower logic threshold level in the intermediate stage as shown in intermediate signal 402. Voltage level Vtlmid results in low signals being stretched and high signals being shrunk as intermediate signal 402 enters level shifter circuit 306. The logic threshold for level shifter circuit 306 is lower than that for level shifter circuit 304. In other words, voltage level VTL is lower than voltage level Vtlmid. A duty cycle distortion occurs again, but due to the inversion of the signal, this inversion reverses the earlier duty cycle change occurring in level shifter circuit 304. The net effect of these inversions of the signal is a preservation of the duty cycle across a wide range of VDD and VDDA voltages without adjustments other than maintaining a VDDMID as an average of these two voltages.

Figure 5:
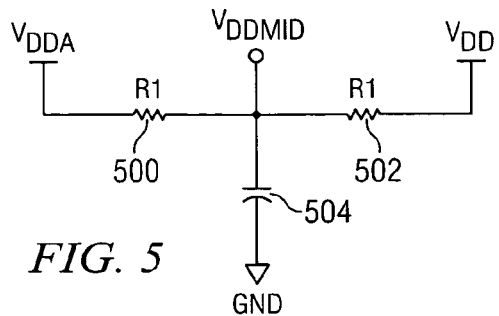
FIG. 5 is a circuit for automatically generating a VDDMID voltage in accordance with an illustrative embodiment of the present invention.

Turning now to FIG. 5, a circuit for automatically generating a VDDMID voltage is depicted in accordance with an illustrative embodiment of the present invention. Resistor 500, resistor 502, and capacitor 504 form a voltage divider and a decap. One end of resistor 500 connects to power supply voltage VDDA with the other end of resistor 500 connecting to resistor 502 and capacitor 504. The other end of resistor 502 connects to power supply voltage VDD. The other end of capacitor 504 connects to lower power supply voltage GND. The voltage drop across capacitor 504 is voltage VDDMID in this illustrative example. In these examples, resistors 500 and 502 have substantially same the resistance value. The value for these resistors should be large enough to keep the DC power for the voltage divider low and maintain high isolation between the two power supply voltages, VDDA and VDD. The values for these resistors should be small enough such that decap deficiencies in capacitor 504 do not cause significant VDDMID noise. VDDA noise is small in analog circuits. VDD noise is large in logic based circuit systems, such as when $1 \times 10^8$ transistors switch simultaneously. VDDMID noise is small, but a large R1 value would mean a large voltage bounce $I_{mid} \times R1$ at VDDMID. Different factors that may contribute to noise include the size of transistors 312 and 314 in FIG. 3 as well as the size of transistors 316 and 318, which contribute to gate capacitance. Additionally, wire capacitance between level shifter 304 and level shifter 306 also may contribute to noise as well as the VDDMID voltage. Increased noise at low temperature due to larger switching currents is another factor that may contribute to noise in these examples.

Figure 6:
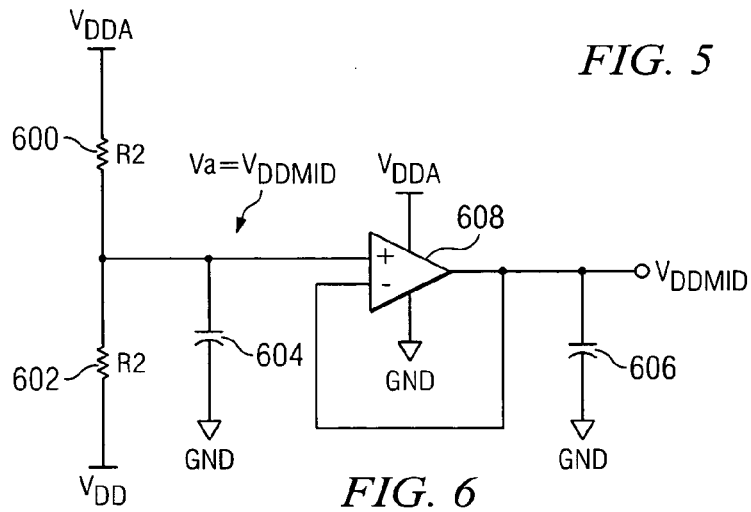
FIG. 6 is a circuit for generating a power supply voltage VDDMID in accordance with an illustrative embodiment of the present invention.

Turning to FIG. 6, a circuit for generating a power supply voltage VDDMID is depicted in accordance with an illustrative embodiment of the present invention.

In this example, resistor 600, resistor 602, capacitor 604, capacitor 606, and operational amplifier 608 form a circuit to generate power supply voltage VDDMID. One end of resistor 600 connects to power supply voltage VDDA with the other end connecting to one end of resistor 602. The other end of resistor 602 connects to power supply voltage VDD. Capacitor 604 has one end that connects to lower power supply voltage GND with the other end connecting to resistor 600 and resistor 602. The connection between capacitor 604, resistor 600, and resistor 602 connects to the positive input of operational amplifier 608. The output of operational amplifier 608 connects to the negative input of this operational amplifier.

Additionally, the output of operational amplifier connects to one end of capacitor 606. The other end of capacitor 606 connects to lower power supply voltage GND. The voltage drop across capacitor 606 is voltage VDDMID. In this particular example, the transient current of the intermediate stage is now isolated from the resistor divider. As a result, the value for resistors 600 and 602 may be very large. Additionally, with this configuration the power may be reduced and high noise isolation is achieved between power supply voltages VDDA and VDD.

Figure 7:
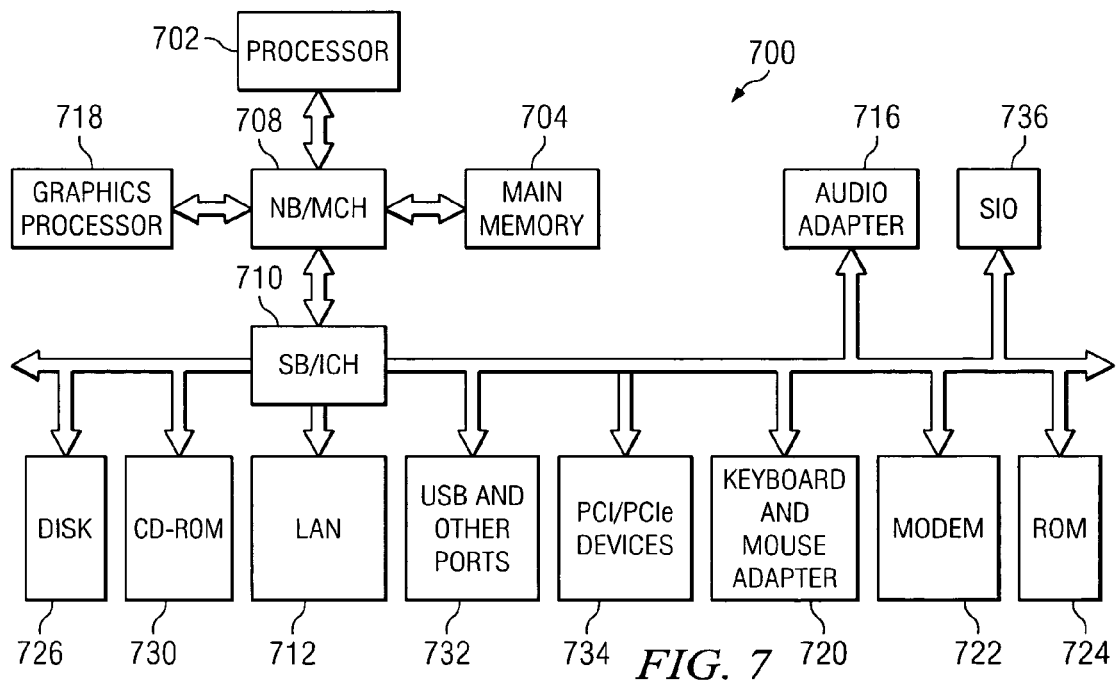
FIG. 7 is a block diagram of a data processing system shown in which aspects of the present invention may be implemented.

With reference now to FIG. 7, a block diagram of a data processing system is shown in which aspects of the present invention may be implemented. In particular, devices within data processing system 700 may implement the level shifter system of the present invention. For example, level shifter system 300 in FIG. 3 may be implemented in devices, such as processor 702 or graphics processor 718. This level shifting system may be implemented within any device in data processing system 700 in which signals are sent from a set of circuits using one voltage domain to a set of circuits using a different voltage domain.

In the depicted example, data processing system 700 employs a hub architecture including a north bridge and memory controller hub (MCH) 708 and a south bridge and input/output (I/O) controller hub (ICH) 710. Processor 702, main memory 704, and graphics processor 718 are connected to MCH 708. Graphics processor 718 may be connected to the MCH through an accelerated graphics port (AGP), for example.

In the depicted example, local area network (LAN) adapter 712, audio adapter 716, keyboard and mouse adapter 720, modem 722, read only memory (ROM) 724, hard disk drive (HDD) 726, CD-ROM drive 730, universal serial bus (USB) ports and other communications ports 732, and PCI/PCIe devices 734 connect to ICH 710. PCI/PCIe devices may include, for example, Ethernet adapters, add-in cards, PC cards for notebook computers, etc. PCI uses a card bus controller, while PCIe does not. ROM 724 may be, for example, a flash binary input/output system (BIOS). Hard disk drive 726 and CD-ROM drive 730 may use, for example, an integrated drive electronics (IDE) or serial advanced technology attachment (SATA) interface. A super I/O (SIO) device 736 may be connected to ICH 710.

An operating system runs on processor 702 and coordinates and provides control of various components within data processing system 700 in FIG. 7. The operating system may be a commercially available operating system such as Microsoft® Windows® XP (Microsoft and Windows are trademarks of Microsoft Corporation in the United States, other countries, or both). An object oriented programming system, such as the Java™ programming system, may run in conjunction with the operating system and provides calls to the operating system from Java programs or applications executing on data processing system 700 (Java is a trademark of Sun Microsystems, Inc. in the United States, other countries, or both).

Instructions for the operating system, the object-oriented programming system, and applications or programs are located on storage devices, such as hard disk drive 726, and may be loaded into main memory 704 for execution by processor 702.

Those of ordinary skill in the art will appreciate that the hardware in FIG. 7 may vary depending on the implementation. Other internal hardware or peripheral devices, such as flash memory, equivalent non-volatile memory, or optical disk drives and the like, may be used in addition to or in place of the hardware depicted in FIG. 7. Also, the level shifter system of the present invention may be applied to a multiprocessor data processing system.

As some illustrative examples, data processing system 700 may be a personal digital assistant (PDA), which is configured with flash memory to provide non-volatile memory for storing operating system files and/or user-generated data. A bus system may be comprised of one or more buses, such as a system bus, an I/O bus and a PCI bus. Of course the bus system may be implemented using any type of communications fabric or architecture that provides for a transfer of data between different components or devices attached to the fabric or architecture. A communications unit may include one or more devices used to transmit and receive data, such as a modem or a network adapter. A memory may be, for example, main memory 704 or a cache such as found in MCH 708. A processing unit may include one or more processors or CPUs. The depicted examples in FIG. 7 and above-described examples are not meant to imply architectural limitations. For example, data processing system 700 also may be a tablet computer, laptop computer, or telephone device in addition to taking the form of a PDA.

Thus, the present invention provides an improved method and apparatus for an interface between power boundaries of components using different power supply voltage levels. The mechanism of the present invention preserves the duty cycles in signals when the signals are sent between different voltage domain components. In this manner, the degradation and loss of signals are minimized using the configurations in these illustrative examples.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method for translating signals from a first voltage of a first voltage source to a second voltage of a second voltage source, wherein a first level shifter that has an input and an output is connected to the first voltage source, and wherein a second level shifter that has an input and an output is connected to the second voltage source, the method comprising:

receiving, by an intermediate level shifter, an input signal from said first level shifter, said input signal having a first duty cycle and a maximum voltage that is said first voltage, wherein said intermediate level shifter has an input and an output, and further wherein the input of the intermediate level shifter connects to the output of the first level shifter; the output of the intermediate level shifter connects to the input of the second level shifter; and wherein the intermediate level shifter includes an intermediate p-channel transistor and an intermediate n-channel transistor, and further wherein an intermediate source of the intermediate p-channel transistor is connected to a constant intermediate voltage source having an intermediate voltage about midway between the first voltage of the first voltage source and the second voltage of the second voltage source; wherein the first voltage is a higher voltage than the second voltage;

shifting, by said intermediate level shifter, said input signal from said first voltage to said intermediate voltage to generate an intermediate signal, wherein said intermediate signal is inverted with respect to said input signal, and wherein positive pulses of said intermediate signal are shrunk and inverted with respect to corresponding pulses of said input signal and negative pulses of said intermediate signal are stretched and inverted with respect to corresponding pulses of said input signal;

receiving, by said second level shifter, said intermediate signal and shifting said intermediate signal to generate an output signal that is inverted with respect to said intermediate signal, said output signal having said first duty cycle and a maximum voltage that is said second voltage; and wherein the second level shifter includes a first p-channel transistor having a first source that is connected to the second voltage source and a first drain that is connected to a second drain of a first n-channel transistor, and wherein the connection of the first drain of the first p-channel transistor and the second drain of the first n-channel transistor form an output that is the output signal, and further wherein a second source of the first n-channel transistor is connected to ground, and still further wherein the second voltage source is a constant voltage source.

2. The method of claim 1, wherein the intermediate level shifter comprises an odd number of inverter circuits.

3. The method of claim 1, wherein the first level shifter circuit is a complementary metal oxide semiconductor inverter.

4. The method of claim 1, wherein the intermediate voltage source comprises:

a first resistor having a first end and a second end, wherein the first end of the first resistor connects to the first voltage source;

a second resistor having a first end and a second end, wherein the first end of the second resistor connects to the second voltage source and the second end of the second resistor connects to the second end of the first resistor and wherein the first resistor has a resistance substantially equal to a resistance for the second resistor; and a capacitor having a first end connected to the second end of the second resistor and a second end connected to a ground voltage, wherein the first end of the capacitor connects to the intermediate level shifter to supply the intermediate voltage.

5. The method of claim 1, wherein the intermediate voltage source comprises:

a first resistor having a first end and a second end, wherein the first end of the first resistor is connected to the first voltage source;

a second resistor having a first end and a second end, wherein the first end of the second resistor connects to the second voltage source and the second end of the second resistor connects to the second end of the first resistor;

a first capacitor having a first end and a second end, wherein the first end of the capacitor connects to the second end of the first resistor and the second end of the capacitor connects to the ground voltage source;

an operational amplifier having a first input, a second input, and an output, wherein the first input of the operational amplifier connects to the second end of the first resistor, the second input of the operational amplifier connects to the output of the operational amplifier, the output of the operational amplifier connects to the intermediate level shifter to supply the intermediate voltage; and a second capacitor having a first end and second end, wherein the first end of the second capacitor connects to the output of the operation amplifier and the second end of the capacitor connects to the ground voltage source.

6. The method according to claim 1, wherein positive pulses of said output signal are shrunk and inverted with respect to corresponding pulses of said intermediate signal and negative pulses of said output signal are stretched and inverted with respect to corresponding pulses of said intermediate signal.

7. The method of claim 1, wherein the first level shifter includes a first p-channel transistor having a first source that is connected to the first voltage source and a first drain that is connected to a second drain of a first n-channel transistor, and wherein the connection of the first drain of the first p-channel transistor and the second drain of the first n-channel transistor form an output that is the input signal, and further wherein a second source of the first n-channel transistor is connected to ground, and still further wherein the first voltage source is a constant voltage source.

8. The method of claim 1, wherein the intermediate level shifter includes the intermediate p-channel having a drain that is connected to a drain of the intermediate n-channel transistor, and wherein the connection of the drain of the intermediate p-channel transistor and the drain of the intermediate n-channel transistor form an output that is the intermediate signal, and further wherein a second source of the intermediate n-channel transistor is connected to ground.

9. A method for translating signals from a first voltage of a first voltage source to a second voltage of a second voltage source, wherein a first level shifter that has an input and an output is connected to the first voltage source, and wherein a second level shifter that has an input and an output is connected to the second voltage source, the method comprising:

receiving, by an intermediate level shifter, an input signal from said first level shifter, said input signal having a first duty cycle and a maximum voltage that is said first voltage, wherein said intermediate level shifter has an input and an output, and further wherein the input of the intermediate level shifter connects to the output of the first level shifter; the output of the intermediate level shifter connects to the input of the second level shifter; and wherein the intermediate level shifter includes an intermediate p-channel transistor and an intermediate n-channel transistor, and further wherein a source of the intermediate p-channel transistor is connected to a constant intermediate voltage source having an intermediate voltage about midway between the first voltage of the first voltage source and the second voltage of the second voltage source; wherein the first voltage is a higher voltage than the second voltage;

shifting, by said intermediate level shifter, said input signal from said first voltage to said intermediate voltage to generate an intermediate signal, wherein said intermediate signal is inverted with respect to said input signal, and wherein positive pulses of said intermediate signal are shrunk and inverted with respect to corresponding pulses of said input signal and negative pulses of said intermediate signal are stretched and inverted with respect to corresponding pulses of said input signal;

receiving, by said second level shifter, said intermediate signal and shifting said intermediate signal to generate an output signal that is inverted with respect to said intermediate signal, said output signal having said first duty cycle and a maximum voltage that is said second voltage;

wherein the first level shifter includes a first p-channel transistor having a first source that is connected to the first voltage source and a first drain that is connected to a second drain of a first n-channel transistor, and wherein the connection of the first drain of the first p-channel transistor and the second drain of the first n-channel transistor form an output that is the input signal, and further wherein a second source of the first n-channel transistor is connected to ground, and still further wherein the first voltage source is a constant voltage source;

wherein the intermediate level shifter includes the intermediate p-channel transistor having a third drain that is connected to a fourth drain of an intermediate n-channel transistor, and wherein the connection of the third drain of the intermediate p-channel transistor and the fourth drain of the intermediate n-channel transistor form an output that is the intermediate signal, and further wherein a third source of the intermediate n-channel transistor is connected to ground; and wherein the second level shifter includes a second p-channel transistor having a fourth source that is connected to the second voltage source and a fifth drain that is connected to a sixth drain of a second n-channel transistor, and wherein the connection of the fifth drain of the second p-channel transistor and the sixth drain of the n-channel transistor form an output that is the output signal, and further wherein a fifth source of the second n-channel transistor is connected to ground, and still further wherein the second voltage source is a constant voltage source.

10. A circuit for translating signals from a first voltage of a first voltage source to a second voltage of a second voltage source, wherein a first level shifter that has an input and an output is connected to the first voltage source, and wherein a second level shifter that has an input and an output is connected to the second voltage source, the circuit comprising:

an intermediate level shifter that receives an input signal from said first level shifter, said input signal having a first duty cycle and a maximum voltage that is said first voltage, wherein said intermediate level shifter has an input and an output, and further wherein the input of the intermediate level shifter connects to the output of the first level shifter; the output of the intermediate level shifter connects to the input of the second level shifter; and wherein the intermediate level shifter includes an intermediate p-channel transistor and an intermediate n-channel transistor, and further wherein a source of the intermediate p-channel transistor is connected to a constant intermediate voltage source having an intermediate voltage about midway between the first voltage of the first voltage source and the second voltage of the second voltage source; wherein the first voltage is a higher voltage than the second voltage;

said intermediate level shifter shifting said input signal from said first voltage to said intermediate voltage to generate an intermediate signal, wherein said intermediate signal is inverted with respect to said input signal, and wherein positive pulses of said intermediate signal are shrunk and inverted with respect to corresponding pulses of said input signal and negative pulses of said intermediate signal are stretched and inverted with respect to corresponding pulses of said input signal;

said second level shifter receiving said intermediate signal and shifting said intermediate signal to generate an output signal that is inverted with respect to said intermediate signal, said output signal having said first duty cycle and a maximum voltage that is said second voltage;

wherein the first level shifter includes a first p-channel transistor having a first source that is connected to the first voltage source and a first drain that is connected to a second drain of a first n-channel transistor, and wherein the connection of the first drain of the first p-channel transistor and the second drain of the first n-channel transistor form an output that is the input signal, and further wherein a second source of the first n-channel transistor is connected to ground, and still further wherein the first voltage source is a constant voltage source;

wherein the intermediate level shifter includes the intermediate p-channel transistor having a third drain that is connected to a fourth drain of an intermediate n-channel transistor, and wherein the connection of the third drain of the intermediate p-channel transistor and the fourth drain of the intermediate n-channel transistor form an output that is the intermediate signal, and further wherein a third source of the intermediate n-channel transistor is connected to ground; and wherein the second level shifter includes a second p-channel transistor having a fourth source that is connected to the second voltage source and a fifth drain that is connected to a sixth drain of a second n-channel transistor, and wherein the connection of the fifth drain of the second p-channel transistor and the sixth drain of the n-channel transistor form an output that is the output signal, and further wherein a fifth source of the second n-channel transistor is connected to ground, and still further wherein the second voltage source is a constant voltage source.

* * * * *